(12) United States Patent
Pillai et al.

(10) Patent No.: US 11,249,678 B2
(45) Date of Patent: Feb. 15, 2022

(54) SERIAL MEMORY DEVICE SINGLE-BIT OR PLURALITY-BIT SERIAL I/O MODE SELECTION

(71) Applicant: QUALCOMM INCORPORATED, San Diego, CA (US)

(72) Inventors: Sunil Pillai, Bangalore (IN); Tarun Kumar, Bangalore (IN); Gopal Karmakar, Bengaluru (IN)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 16/523,429

(22) Filed: Jul. 26, 2019

(65) Prior Publication Data

US 2021/0026560 A1 Jan. 28, 2021

(51) Int. Cl.
*G06F 3/06* (2006.01)
*G06F 9/4401* (2018.01)
*G06F 13/16* (2006.01)
*G06F 13/42* (2006.01)

(52) U.S. Cl.
CPC .......... *G06F 3/0659* (2013.01); *G06F 3/0604* (2013.01); *G06F 3/0673* (2013.01); *G06F 9/4411* (2013.01); *G06F 13/1668* (2013.01); *G06F 13/4282* (2013.01)

(58) Field of Classification Search
CPC .. G06F 3/0659; G06F 3/0604; G06F 13/1668; G06F 13/4282; G06F 3/0673; G06F 9/4411; G11C 7/20; G11C 7/1045; G11C 16/20; G11C 16/32; G11C 5/066

USPC ............ 713/1, 2, 100; 711/103; 710/10, 14; 365/221

See application file for complete search history.

(56) References Cited

U.S. PATENT DOCUMENTS

| | | | |
|---|---|---|---|
| 8,250,287 B1 | 8/2012 | Mirichigni | |
| 8,380,914 B1 * | 2/2013 | Kale | G11C 8/04 711/2 |
| 2005/0057973 A1 | 3/2005 | Khatami et al. | |

(Continued)

OTHER PUBLICATIONS

Spiflash 8M-bit, 16 M-bit and 32M-bit Serial Flash Memory with Dual and Quad SPI, winbond, pp. 1-61, Sep. 26, 2007 (Year: 2007).*

(Continued)

*Primary Examiner* — Hong C Kim
(74) *Attorney, Agent, or Firm* — Smith Tempel Blaha LLC/Qualcomm (57) ABSTRACT

Methods and apparatuses for memory device mode selection in a serial memory device are presented. Memory device configuration information may be retrieved in response to a memory device initialization condition, and a configuration register bit mask that is included in the memory device configuration information may then be written to a configuration register of the memory device. A write command that may also be included in the memory device configuration information may be used to write the configuration bit mask to the configuration register. The serial memory device may be a serial flash memory. The configuration register bit mask may include an I/O mode bit setting that indicates enabling the memory to operate in a quad-bit I/O mode or other multi-bit serial I/O mode instead of a single-bit serial I/O mode.

22 Claims, 8 Drawing Sheets

(56) References Cited

U.S. PATENT DOCUMENTS

| | | | | |
|---|---|---|---|---|
| 2005/0160256 A1* | 7/2005 | Huang | .................... | H04L 29/06 |
| | | | | 713/2 |
| 2010/0042778 A1* | 2/2010 | Tanguay | ................. | G11C 5/04 |
| | | | | 711/105 |
| 2012/0191964 A1* | 7/2012 | Lee | .................... | G06F 11/2289 |
| | | | | 713/2 |
| 2014/0013036 A1* | 1/2014 | Kwon | ................... | G06F 9/4401 |
| | | | | 711/103 |
| 2014/0195723 A1 | 7/2014 | Rolandi et al. | | |
| 2015/0220431 A1* | 8/2015 | Rolandi | ............. | G06F 9/30098 |
| | | | | 711/103 |
| 2015/0347151 A1* | 12/2015 | Takefman | ............ | G06F 9/4411 |
| | | | | 713/2 |
| 2018/0157443 A1* | 6/2018 | Schumacher | ........ | G06F 3/0679 |
| 2019/0163401 A1* | 5/2019 | Yamauchi | ............. | G06F 3/0604 |

OTHER PUBLICATIONS

International Search Report and Written Opinion—PCT/US2020/043531—ISA/EPO—dated Nov. 18, 2020.

\* cited by examiner

| Manufacturer ID | Memory ID | QE Bit Mask | Write Command | Read Command | Wait Time |
|---|---|---|---|---|---|
| (1 byte) | (2 bytes) | (1 byte) | (1 byte) | (1 byte) | (2 bytes) |

SERIAL MEMORY DEVICE SINGLE-BIT OR PLURALITY-BIT SERIAL I/O MODE SELECTION

BACKGROUND

Field

The present disclosure relates generally to serial memory devices and, more particularly, to methods and apparatuses for enabling or selecting a plural-bit serial input/output (I/O) mode in a serial memory device instead of a single-bit serial I/O mode.

Background

A computing device (e.g., laptop computer, mobile phone, etc.) may include one or more processors to perform various functions, such as telephony, wireless data access, camera/video functions, etc. A processor may be coupled to a memory in which processor instructions and data may be stored. The memory may be embedded with a processor on a semiconductor die or be part of a different semiconductor die. The memory may perform various functions. For example, the memory may be used as a cache, register file, or storage. The memory may be any of various kinds. For example, the memory may be static random access memory (SRAM), dynamic random access memory (DRAM), magnetic random access memory (MRAM), NAND flash, or NOR flash, etc. Some types of flash memory devices provide only serial data access, as opposed to parallel data access. Such flash memory devices are commonly referred to as serial flash memory devices. Some types of serial flash memory devices are capable of being configured to operate in a selected one of a plurality of serial I/O modes, such as a single-bit serial I/O mode and a quad-bit serial I/O mode. In the single-bit I/O mode, data bits are input to the flash memory device in serial format on a single input line and read from the flash memory device in serial format on a single output line. In the quad-bit I/O mode, data are input and output on four serial I/O lines. The I/O mode may be selected using a configuration register in the flash memory device. Several methods of selecting the I/O mode are known, and the method employed may depend upon characteristics of the flash memory device, such as whether the configuration register is volatile or non-volatile.

SUMMARY

This summary identifies features of some exemplary aspects and is not an exclusive or exhaustive description of the disclosed subject matter. Additional features and aspects are described and will become apparent to persons skilled in the art upon reading the following detailed description and viewing the drawings that form a part thereof.

A method for memory device mode selection in accordance with at least one embodiment includes retrieving memory device configuration information in response to a memory device initialization condition, and writing I/O mode information that is included in the memory device configuration information to a configuration register of the memory device. A write command that may also be included in the memory device configuration information may be used to write the configuration bit mask to the configuration register. The memory device may be a serial flash memory. The I/O mode information may indicate enabling the memory to operate in a plural-bit I/O mode, such as a quad-bit I/O mode.

An apparatus for memory device mode selection in accordance with at least one embodiment includes a host coupled to a memory device via a link. The host may comprise a processor system configured to retrieve memory device configuration information in response to a memory device initialization condition, and to write I/O mode information that is included in the memory device configuration information to a configuration register of the memory device. A write command that may also be included in the memory device configuration information may be used to write the configuration bit mask to the configuration register. The memory device may be a serial flash memory. The I/O mode information may indicate enabling the memory to operate in a plural-bit I/O mode, such as a quad-bit I/O mode.

Another apparatus for memory device mode selection in accordance with at least one embodiment includes a memory device and a processor system configured to retrieve memory device configuration information in response to a memory device initialization condition, and to write I/O mode information that is included in the memory device configuration information to a configuration register of the memory device. A write command that may also be included in the memory device configuration information may be used to write the configuration bit mask to the configuration register. The memory device may be a serial flash memory. The I/O mode information may indicate enabling the memory to operate in a plural-bit I/O mode, such as a quad-bit I/O mode.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" may mean a transfer of electrical energy between elements A and B, to operate certain intended functions.

In some examples, the term "electrically connected" may mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. may be employed for ease of reference and may not carry substantive meanings. Likewise, names for components/modules may be adopted for ease of reference and might not limit the components/modules. Modules and components presented in the disclosure may be implemented in hardware, software, or a combination of hardware and software.

The term "bus system" may provide that elements coupled to the "bus system" may exchange information therebetween, directly or indirectly. In such fashion, the "bus system" may encompass multiple physical connections as well as intervening stages such as buffers, latches, registers, etc. A module may be implemented in hardware, software, or a combination of hardware and software. The terms "software" and "firmware" are used synonymously in this disclosure.

One method of selecting a serial flash memory I/O mode involves, upon boot-up of the system incorporating the flash memory device, using the single-bit I/O mode to read configuration information from a file in the flash memory device itself and to write the value of the I/O mode enable bit (e.g., quad enable or "QE" bit) indicated in the configuration information to the configuration register. In response to setting the QE bit value in this manner, the flash memory device configures itself to operate in the quad-bit serial I/O mode instead of the single-bit serial I/O mode. Using the configuration register to select an I/O mode may present a number of challenges to manufacturers of devices that incorporate serial flash memory devices. For example, the manner in which the configuration register may be used to select an I/O mode may not be the same among all serial flash memory devices, such as those produced by different memory device manufacturers.

Methods and apparatuses for input/output (I/O) mode selection in a serial flash memory device are presented. A serial flash memory is generally a compact, low-power device that provides only serial access (i.e., no parallel access) to the data. Rather than being configured to address individual bytes, a serial flash memory device is configured to read or write contiguous groups of bytes in the address space by receiving as input in serial format bits to be written and providing as output in serial format bits that have been read. Conventional flash memory devices are commonly operable in a single-bit I/O mode, in which all bits to be written are received on a single input data line, and all bits that have been read are provided on a single output data line. Operating in the single-bit I/O mode, the Serial Peripheral Interface (SPI) protocol is commonly used for accessing the flash memory device. However, some flash memory devices are also operable in one or more plural-bit I/O modes in addition to the single-bit I/O mode. A common plural-bit I/O mode is quad-bit I/O mode, in which data are input and output on four I/O lines (i.e., four bits per clock cycle). Dual-bit I/O mode, in which data are input and output on two I/O lines (i.e., two bits per clock cycle) is another common plural-bit I/O mode.

As described below, the I/O mode in which a serial flash memory device is to operate may be selected by setting bit values in a configuration register in the device. For example, one of the configuration register bits may be a quad enable or "QE" bit. When the flash memory device initially powers up, the QE bit of the configuration register may be set to a default value of, for example, "0", indicating that the flash memory device is operable in the single-bit I/O mode. If a "1" is subsequently written to the QE bit, the flash memory device may respond by becoming operable in the quad-bit I/O mode. The QE bit may be set to indicate quad-bit I/O mode operation as part of a boot-up process of an apparatus (e.g., computing system, mobile computing device, etc.) that includes or incorporates the flash memory.

While aspects of the single-bit I/O mode are somewhat standardized (e.g., per the SPI protocol), aspects of plural-bit I/O modes in serial flash memory devices that provide such modes are not as standardized. For example, the position of the plural-bit I/O mode enable bit (e.g., QE) in the configuration register, whether the configuration register is volatile or non-volatile, and the manner in which data are written and read in plural-bit I/O modes (e.g., read and write commands, wait time specification, etc.) may differ among flash memory devices produced by different manufacturers or potentially even among different flash memory device products from the same manufacturer. For brevity, flash memory devices that are functionally different from each other in these or other relevant aspects described below are referred to in this disclosure as "different memories" or, in the context of a particular or exemplary memory device, as "another memory" or "other memories."

Figure 1:
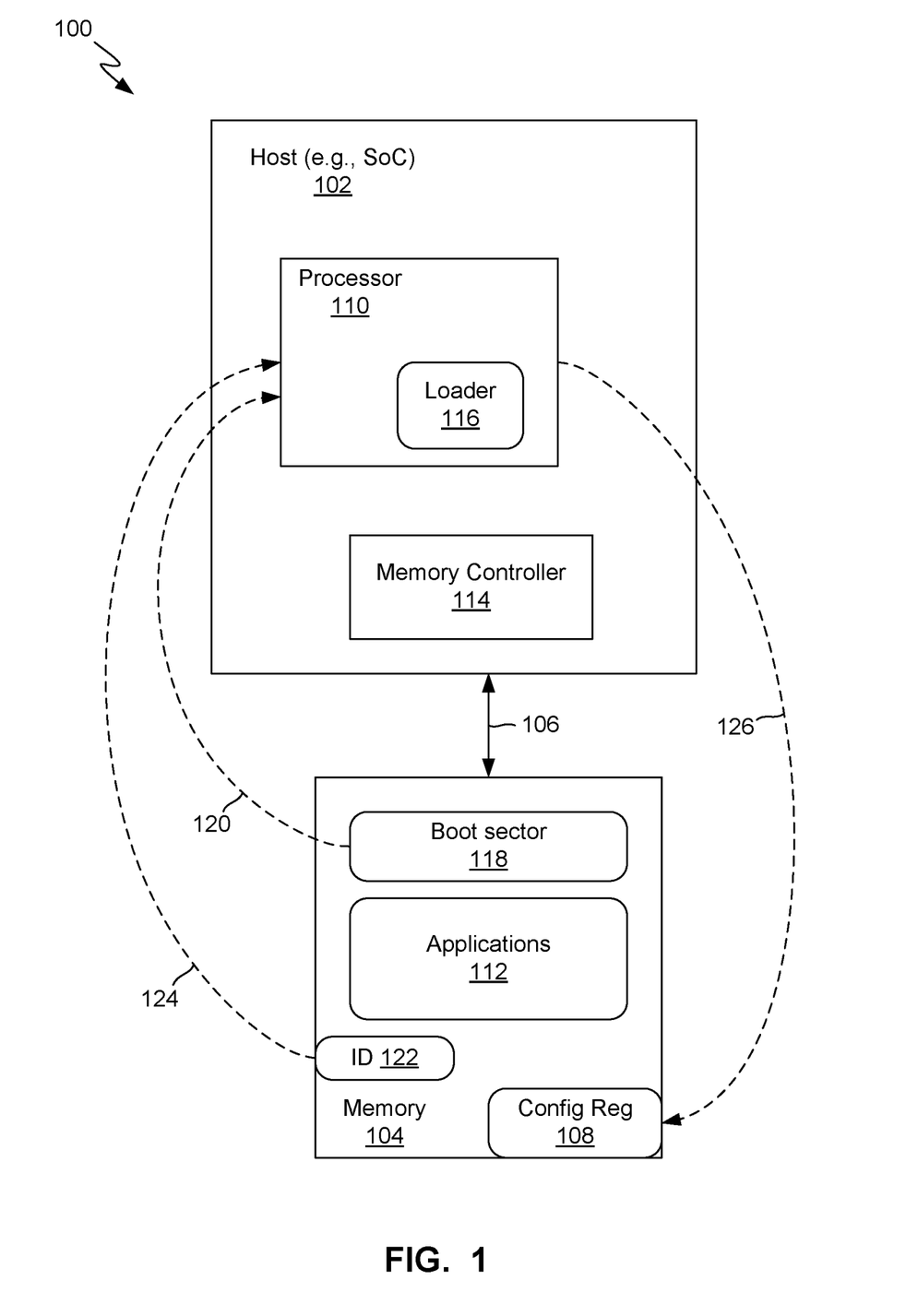
FIG. 1 illustrates an apparatus for memory device mode selection, in accordance with certain aspects of the disclosure.

FIG. 1 illustrates an apparatus 100 that includes a processor system or host 102, a memory 104, and a link 106 coupling the host 102 and the memory 104, in accordance with certain aspects of this disclosure. The memory 104 may be, for example, a serial flash memory having a feature by which the memory 104 is selectably operable in one of a single-bit I/O mode and a plural-bit (e.g., quad-bit) I/O mode. As described below, the memory 104 bit operates in the I/O mode indicated by bit settings in a configuration register 108 (also commonly referred to as a status register).

The apparatus 100 may be, for example, one of: a computing system (e.g., server, datacenter, desktop computer), a mobile computing device (e.g., laptop, cell phone, vehicle, etc.), an Internet of Things (IoT) device, a virtual reality (VR) system, an augmented reality (AR) system, etc. The host 102 may include at least one processor 110 (e.g., a central processing unit (CPU), digital signal processor (DSP), graphics processing unit (GPU), etc.) coupled to the memory 104 via the link 106 to perform one or more computing functions, such as data processing, data communication, graphic display, camera operation, AR or VR rendering, image processing, etc. For example, the memory 104 may store instructions or data (e.g., applications 112) for the at least one processor 110 to perform the aforementioned computing function or functions. The host 102 may be implemented as a system-on-chip (SoC) that includes multiple processors and other devices, interconnected by data buses or other interconnections (not shown for purposes of clarity). In some examples, the link 106 may be a chip-to-chip or a die-to-die link between the host 102 and the memory 104, the host 102 and the flash memory 104 being on separate dies. In other examples, the link 106 may be an in-die link, the host 102 and the memory 104 being on the same die.

The host 102 may communicate data and commands with the memory 104 via the link 106, either directly under the control of the processor 110 or indirectly by the processor 110 via a memory controller 114 or other intermediary device. The processor 110 may operate under the control of firmware, which may include a loader 116 relating to the multi-bit I/O mode configuration methods described below. Although in FIG. 1 the loader 116 is conceptually shown for purposes of clarity as resident in the processor 110, one of ordinary skill in the art understands that the loader (firmware) 116 may be stored in or reside in any storage location accessible to the processor 110, such as, for example, in a read-only memory (not shown) in the host 102 or connected to the host 102. The loader 116 may execute on the processor 110 in a conventional manner, which may include the processor 110 fetching instructions from such firmware memory on an as-needed basis. The processor 110 may execute the loader 116 to perform the methods (or portions thereof) described below with regard to FIGS. 5-7.

Figure 2A:
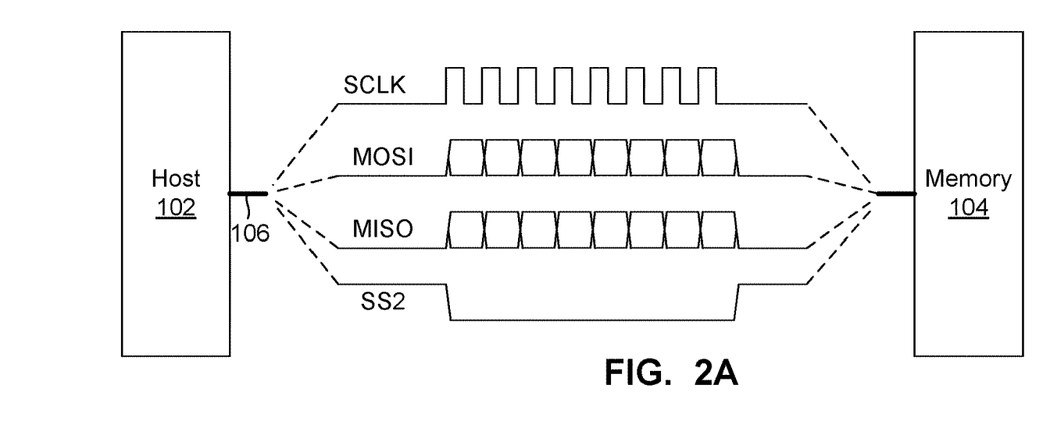
FIG. 2A illustrates an example of conventional operation of a serial flash memory in a single-bit I/O mode.

FIG. 2A illustrates examples of waveforms representing signals that may be communicated via corresponding signal lines of the link 106 between the host 102 and the memory 104 when the memory 104 is operating in the single-bit I/O mode. The signals (and corresponding signal lines) may include, for example, a clock (SCLK), a serial data output (MOSI), a serial data input (MISO), and a chip enable (SS2). As such signals and their operation are well understood by one of ordinary skill in the art, such aspects are not described herein. Note that four signal lines of the link 106 are used in the single-bit I/O mode in this example.

Figure 2B:
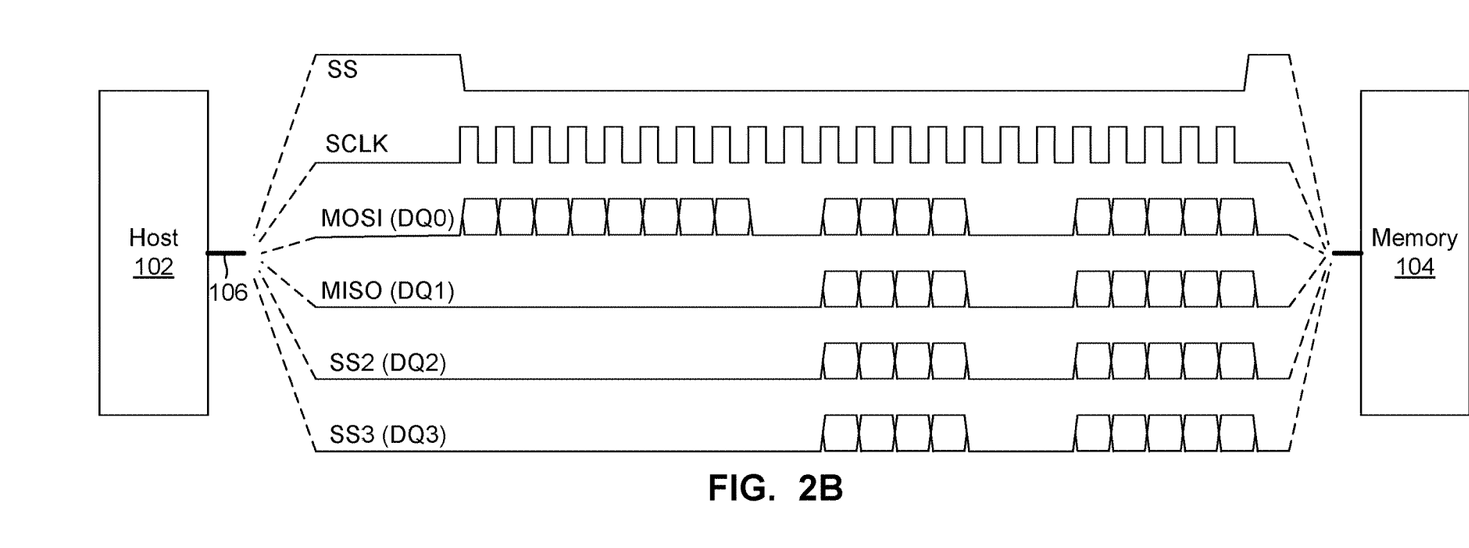
FIG. 2B illustrates an example of conventional operation of a serial flash memory in a quad-bit I/O mode.

FIG. 2B illustrates examples of waveforms representing signals that may be communicated via corresponding signal lines of the link 106 between the host 102 and the memory 104 when the memory 104 is operating in a quad-bit I/O mode. The signals may include, for example, a chip enable signal (SS), a clock signal (SCLK), a first bit serial data signal (DQ0), a second bit serial data signal (DQ1), a third bit serial data signal (DQ2), and a fourth bit serial data signal (DQ3). As such signals and their operation are well understood by one of ordinary skill in the art, such aspects are not described herein. Note that six signal lines of the link 106 are used in the quad-bit I/O mode in this example. Also note that the two signal lines used to communicate the DQ0 and DQ1 signals in the quad-bit I/O mode are also used to communicate the MOSI and MISO signals in the single-bit I/O mode (FIG. 2A). Some signal lines of the link 106 may thus be repurposed for alternative functions when a different I/O mode is selected.

Figure 3:
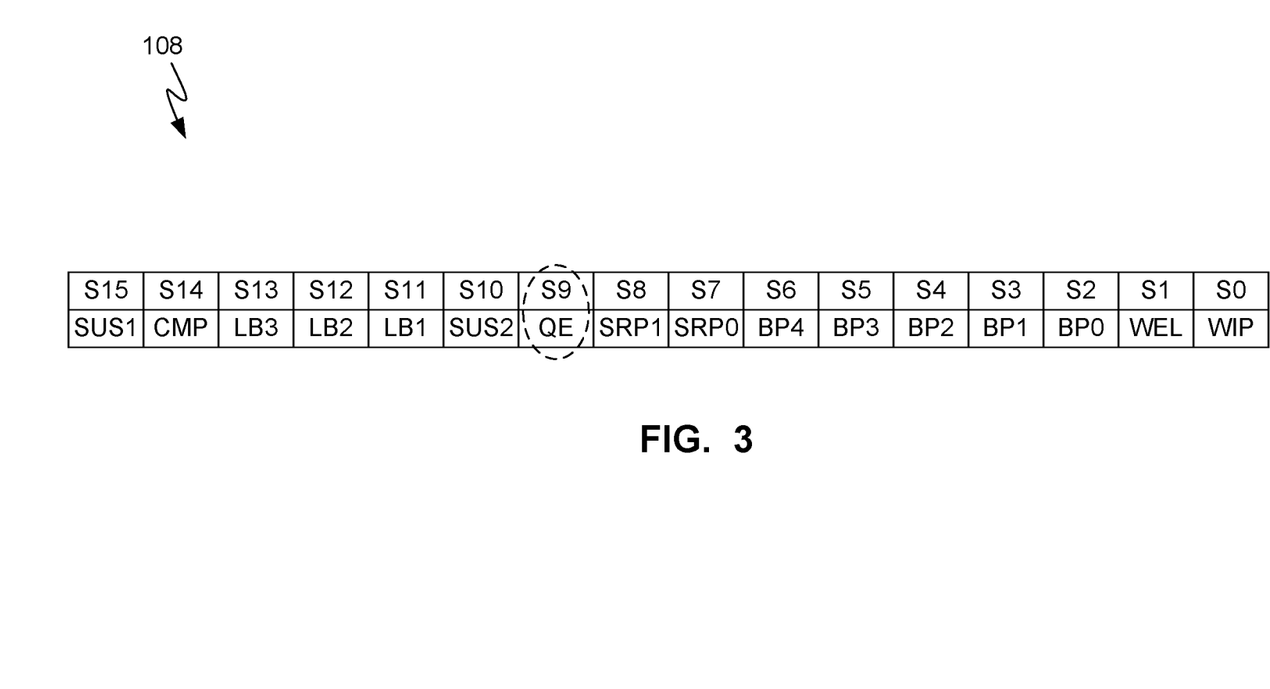
FIG. 3 illustrates an example of a configuration register of a conventional serial flash memory device configurable to operate in one of a single-bit I/O mode and a quad-bit I/O mode.

FIG. 3 illustrates an exemplary structure of the configuration register 108 (FIG. 1) of the memory 104. The configuration register 108 may consist of, for example, 16 bits (labeled S0-S15 in FIG. 3). The memory 104 configures itself to operate in various respects based on a 16-bit word that may be written to the configuration register 108. One of ordinary skill in the art understands the functions of the various bits of the configuration register 108 as described in documentation (commonly referred to as data sheets) published by the manufacturer of the memory 104. As the memory 104 may be of a commercially available type, such documentation is readily available to one of ordinary skill in the art. Of the bits of the configuration register 108, only the QE bit (in the S9 bit position in this example, and circled in broken line in FIG. 3 for clarity) is relevant to the present disclosure. Accordingly, for brevity, the functions of bits of the configuration register 108 other than the QE bit are not described in this disclosure.

It should be understood that the structure, i.e., bit functions and corresponding bit positions, of the configuration register 108 illustrated in FIG. 3 is intended only as an example, and that different memories, such as those provided by other manufacturers or even different products of the same manufacturer, may have different structures. Regardless of such possible differences in structure, at least one of the bits is an I/O mode bit that relates to enabling a plural-bit serial I/O mode or, more generally, to selecting one of a plurality of serial I/O modes. The I/O mode bit setting of the one or more I/O mode bits may indicate one of a first I/O mode and a second I/O mode. For example, the I/O mode bit setting may indicate one of a single-bit serial I/O mode and a plural-bit (e.g., dual-bit, quad-bit, etc.) serial I/O mode. In the example illustrated in FIG. 3, the QE bit (S9) may be set to either a "0" or a "1" by performing a write operation to the configuration register 108. For example, in response to the QE bit being set to a "0", the memory 104 may configure itself to operate in the above-described single-bit I/O mode, and in response to the QE bit being set to a "1", the memory 104 may configure itself to operate in the above-described quad-bit I/O mode. The memory 104 may have a default I/O mode in which it begins operating upon powering up, i.e., before any write operation upon the configuration register 108. For example, the memory 104 may default to the single-bit I/O mode upon powering up.

Figure 4:
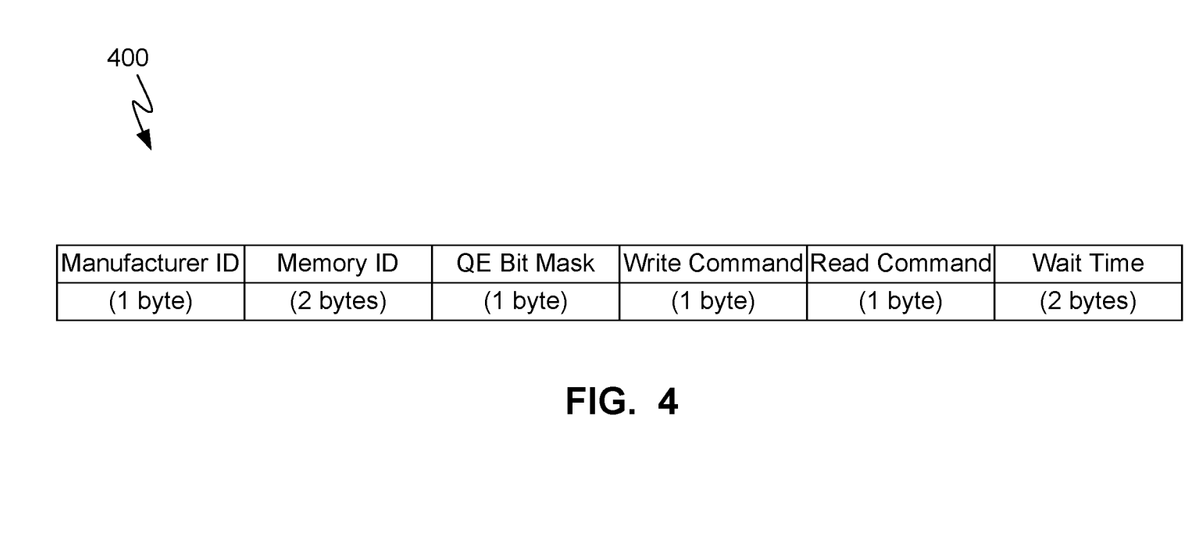
FIG. 4 illustrates an example of configuration information, in accordance with certain aspects of the disclosure.

FIG. 4 illustrates an exemplary structure of memory device configuration information 400. The memory device configuration information 400 may include a configuration register bit mask that indicates the bit position of the above-described I/O mode bit and the value to which the I/O mode bit is set to indicate the plural-bit I/O mode. For example, in accordance with the exemplary structure shown in FIG. 4, the configuration register bit mask (QE Bit Mask) of the memory device configuration information 400 may indicate that the QE bit is in the S9 bit position of the configuration register 108 and is set to a "1" to enable the quad-bit I/O mode. The QE Bit Mask may be, for example, one byte in length. It should be understood that the configuration register bit mask may differ among different memories because, as described above, the configuration register bit position of the I/O mode bit may differ among different memories. For example, in a different memory (other than the exemplary memory 104, which has the exemplary configuration register structure illustrated in FIG. 3), the QE bit may be located in a bit position other than S9.

The memory device configuration information 400 may include a Write Command, which is the instruction or command to which the memory 104 responds by performing a write operation. Similarly, the memory device configuration information 400 may include a Read Command, which is the instruction or command to which the memory 104 responds by performing a read operation. It should be understood that the Write Command and Read Command may differ among different memories.

The memory device configuration information 400 may also include a Wait Time. The Wait Time is the minimum amount of time after a write operation is performed before newly written data is specified as becoming readable. It should be understood that the Wait Time may differ among different memories.

The memory device configuration information 400 may also include device identification (ID) information that uniquely identifies the memory 104 from among various different memories (e.g., produced by different manufacturers). The device ID information may include, for example, a Manufacturer ID and a Memory ID that together identify a particular product of a particular manufacturer.

The memory device configuration information 400 may have the exemplary structure illustrated in FIG. 4 or any other structure. Regardless of what the structure may be, that same structure may be employed to store the memory device configuration information 400 for any memory of a plurality of different memories. For example, the exemplary structure illustrated in FIG. 4 indicates that the memory device configuration information 400 may consist of eight contiguous bytes: Manufacturer ID (one byte), Memory ID (two bytes), QE Bit Mask (one byte), Write Command (one byte), Read Command (one byte), and Wait Time (two bytes). Such a structure may be employed to store the memory device configuration information 400 not only for the memory 104 having the exemplary configuration information 108 illustrated in FIG. 3 but also for other (i.e., different) memories having other configuration register structures. Nevertheless, it should be understood that the structure illustrated in FIG. 4 is intended only to be exemplary. In other examples (not shown), the memory device configuration information 400 may include more information or less information than in the illustrated example, and each field or item of information may be represented by more or fewer bits/bytes than in the illustrated example. Further, in other examples the various fields or items of memory device configuration information 400 may be organized in a different order than in the illustrated example, or stored non-contiguously.

Figure 5:
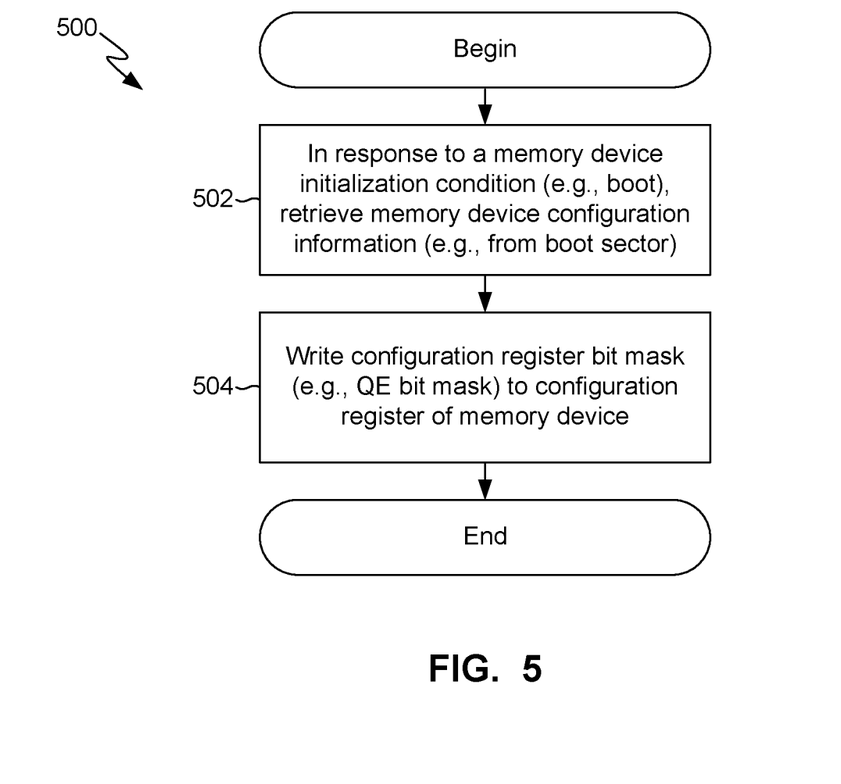
FIG. 5 is a flow diagram illustrating a method for memory device mode selection, in accordance with certain aspects of the disclosure.

FIG. 5 illustrates a method 500 for selecting a memory I/O mode. The operations described below with regard to FIG. 5 may be implemented by or under the control of, for example, the apparatus 100 (FIG. 1). More specifically, the operations may be implemented by or under the control of, for example, the processor 110 executing the loader 116.

As indicated by block 502, the method 500 may include retrieving memory device configuration information in response to a memory device initialization condition. The memory device configuration information may include a configuration register bit mask. The configuration register bit mask may include an I/O mode bit setting that indicates enabling of a quad-bit I/O mode or other plural-bit I/O mode. The memory device initialization condition may be, for example, a condition in which the apparatus 100 (FIG. 1) is booted up, powered-on, or otherwise initialized in preparation for operation.

As indicated by block 504, the method 500 may further include writing the configuration register bit mask to a configuration register of the memory device, such as the configuration register 108 (FIG. 1) of the memory 104. The Write Command indicated in the retrieved memory device configuration information may be used to write the configuration register bit mask to the configuration register and may indicate the location of the configuration register. For example, this write operation may include writing a value to the QE bit of the configuration register 108 that indicates enabling operation in the quad-bit I/O mode. In accordance with the example described above with regard to FIG. 3, a "1" may be written to the S9 bit, i.e., the QE bit, of the configuration register 108 to enable operation in the quad-bit I/O mode. Note that prior to writing a value to the QE bit of the configuration register 108 that indicates enabling operation in the quad-bit I/O mode, the memory 104 may be operable in the single-bit I/O mode and not operable in the quad-bit I/O mode. However, in response to writing such a value to the QE bit, the memory 104 may configure itself to subsequently operate in the quad-bit I/O mode. That is, the memory 104 may switch or change from operating in the single-bit I/O mode to operating in the quad-bit I/O mode. Although not shown in FIG. 5, after enabling the quad-bit I/O mode in this manner, further write and read operations may be performed using the quad-bit I/O mode.

Figure 6:
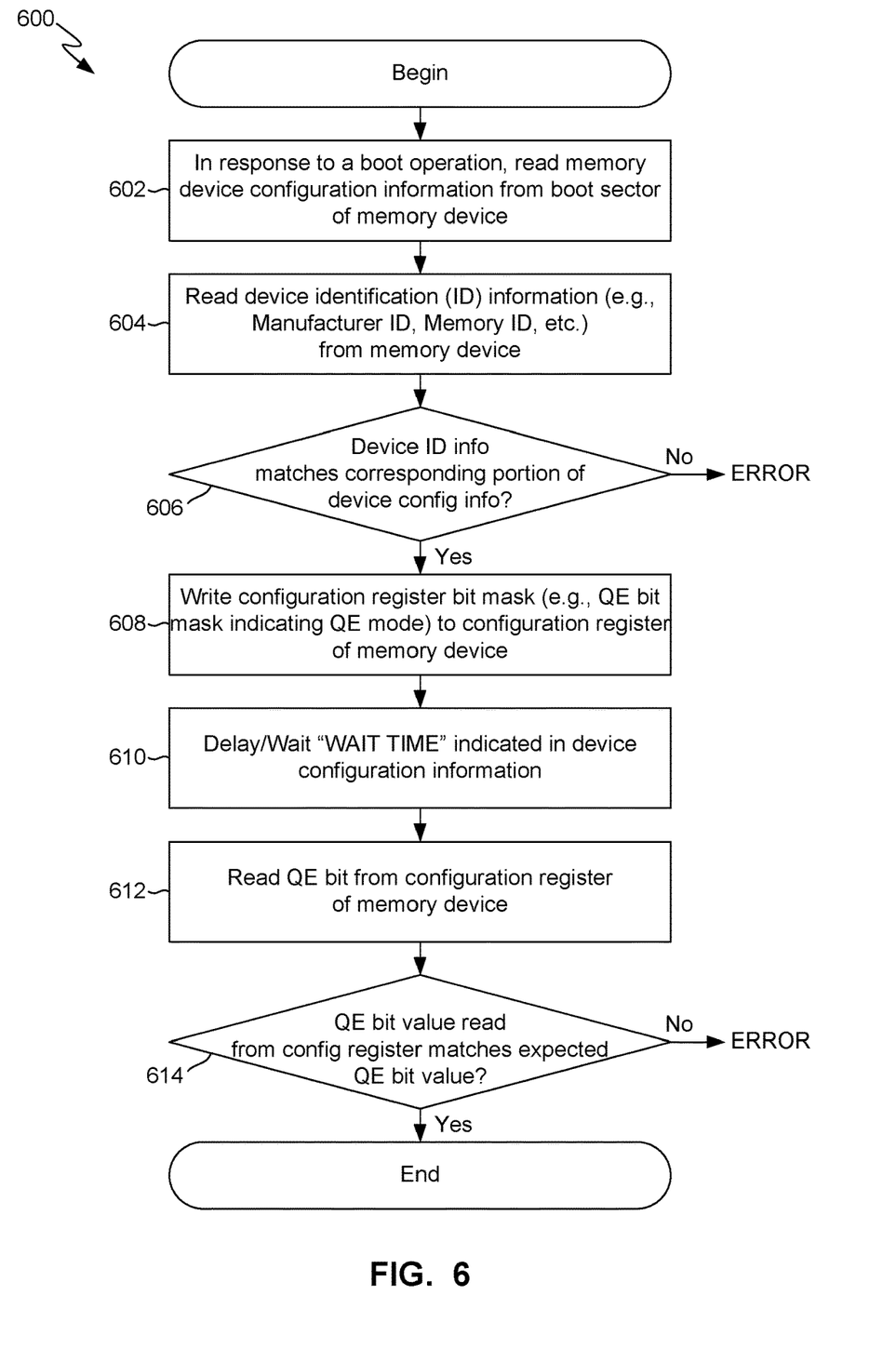
FIG. 6 is a flow diagram illustrating another method for memory device mode selection, in accordance with certain aspects of the disclosure.

FIG. 6 illustrates a method 600 for selecting a memory I/O mode. The method 600 may be an example of the above-described method 500 (FIG. 5). The operations described below with regard to the method 600 may be implemented by or under the control of, for example, the processor 110. The processor 110 may perform the method 600 under the control of the loader 116 (e.g., a portion of the processor's firmware). In this exemplary method 600, the above-described memory device configuration information 400 (FIG. 4) is pre-stored in the boot sector 118 (FIG. 1) of the memory 104. Before the method 600 is performed, an entity such as the manufacturer of the apparatus 100 (i.e., an Original Equipment Manufacturer or "OEM") may store the memory device configuration information 400 in the boot sector 118. The entity may store the memory device configuration information 400 in the boot sector 118 using any means, such as, for example, a computer-based tool (not shown) to which the memory 104 may be connected for purposes of configuring it prior to incorporating the memory 104 into the apparatus 100.

As indicated by block 602, the method 600 may include reading the memory device configuration information 400 (FIG. 4) from the boot sector 118 (FIG. 1) of the memory 104 in response to a boot-up of the apparatus 100 that incorporates the memory 104. As reading the memory device configuration information 400 may be implemented by or under the control of the processor 110, an arrow 120 (FIG. 1) conceptually indicates this retrieval of memory device configuration information 400 from the boot sector 118 by the processor 110. It should be noted that the memory 104 may be operating in the single-bit I/O mode as a default mode in which it powers up. Accordingly, the processor 110 may use the single-bit I/O mode to read the memory device configuration information 400. It is not necessary for the processor 110 to use the Read Command to read the memory device configuration information 400 from the boot sector 118, as read and write operations using the single-bit I/O mode are standardized across the various different memories. As understood by one of ordinary skill in the art, the command to perform a read operation in the single-bit I/O mode is a "standard" in the sense that the same command may be used in the same way with different memories. When reading and writing data in the quad-bit I/O mode, the standard read and write commands may be used alternatively to the Read and Write Commands indicated in the memory device configuration information 400.

As indicated by block 604, the method 600 may also include reading device ID information 122 (FIG. 1) from the memory 104. As reading the device ID information 122 may be implemented by or under the control of the processor 110, an arrow 124 (FIG. 1) conceptually indicates this retrieval of device ID information 122 from a location in the memory 104 by the processor 110. The processor 110 may use a standard command (e.g., in accordance with a JEDEC standard) to read the device ID information. As understood by one of ordinary skill in the art, the (e.g., JEDEC) command to read the device ID is a "standard" in the sense that the same command may be used in the same way with different memories. The location in the memory 104 from which the device ID information 122 is read may be transparent to the processor 110. That is, the JEDEC command does not require the processor 110 to provide an address or otherwise specify the source from which the requested device ID information is to be read. The location in which the device ID information is stored in anticipation of retrieval using a standard JEDEC command may differ among different memories. The memory manufacturer may select the location in the memory in which the device ID information is stored and store the device ID information therein for retrieval in a manner transparent to the requestor (e.g., processor). Thus the device ID information already may be stored in the memory 104 (i.e., it may be pre-stored) at the time the manufacturer of the apparatus 100 incorporates the memory 104 into the apparatus 100.

As indicated by block 606, the method 600 may then include comparing the device ID information 122 read from the memory 104 using the standard (e.g., JEDEC) command with the device ID information comprising the Manufacturer ID and Memory ID portions of the memory device configuration information 400 read from the boot sector 118 of the memory 104 using the single-bit I/O mode to determine if they match. If they do not match, an error handling step (not shown) may be performed.

As indicated by block 608, if the comparison (block 606) does not indicate an error, then the method 600 may proceed with writing the configuration register bit mask portion of the memory device configuration information 400 to the configuration register 108 of the memory 104. The Write Command indicated in the retrieved memory device configuration information 400 may be used. Alternatively, a standard command may be used. This write operation may include writing a value to the QE bit of the configuration register 108 that indicates enabling operation in the quad-bit I/O mode. In accordance with the example described above with regard to FIG. 3, a "1" may be written to the S9 bit, i.e., the QE bit, of the configuration register 108 to enable operation in the quad-bit I/O mode. An arrow 126 (FIG. 1) conceptually indicates writing the configuration register bit mask, including the QE bit, to the configuration register 108 of the memory 104 by the processor 110. In response to writing such a QE bit value, the memory 104 may configure itself to operate in the quad-bit I/O mode instead of the single-bit I/O mode.

The processor 110 may then confirm that the QE bit was correctly written. However, before reading the contents of the configuration register 108 as indicated by block 612, the processor 110 may ensure that a delay time of at least the Wait Time indicated in the memory device configuration information 400 has elapsed, as indicated by block 610. The processor 110 may read the configuration register 108 using the single-bit I/O mode.

As indicated by block 614, the method 600 may then include comparing the value of the QE bit read (per block 612) from the configuration register 108 with the value of the QE bit written (per block 608) to the configuration register 108. If they do not match, an error handling step (not shown) may be performed. If the comparison (block 614) does not indicate an error, then the method 600 is completed, and further memory access operations may be performed using the quad-bit I/O mode. Such further memory access operations may include reading or writing data under control of, for example, one or more applications 112.

Figure 7:
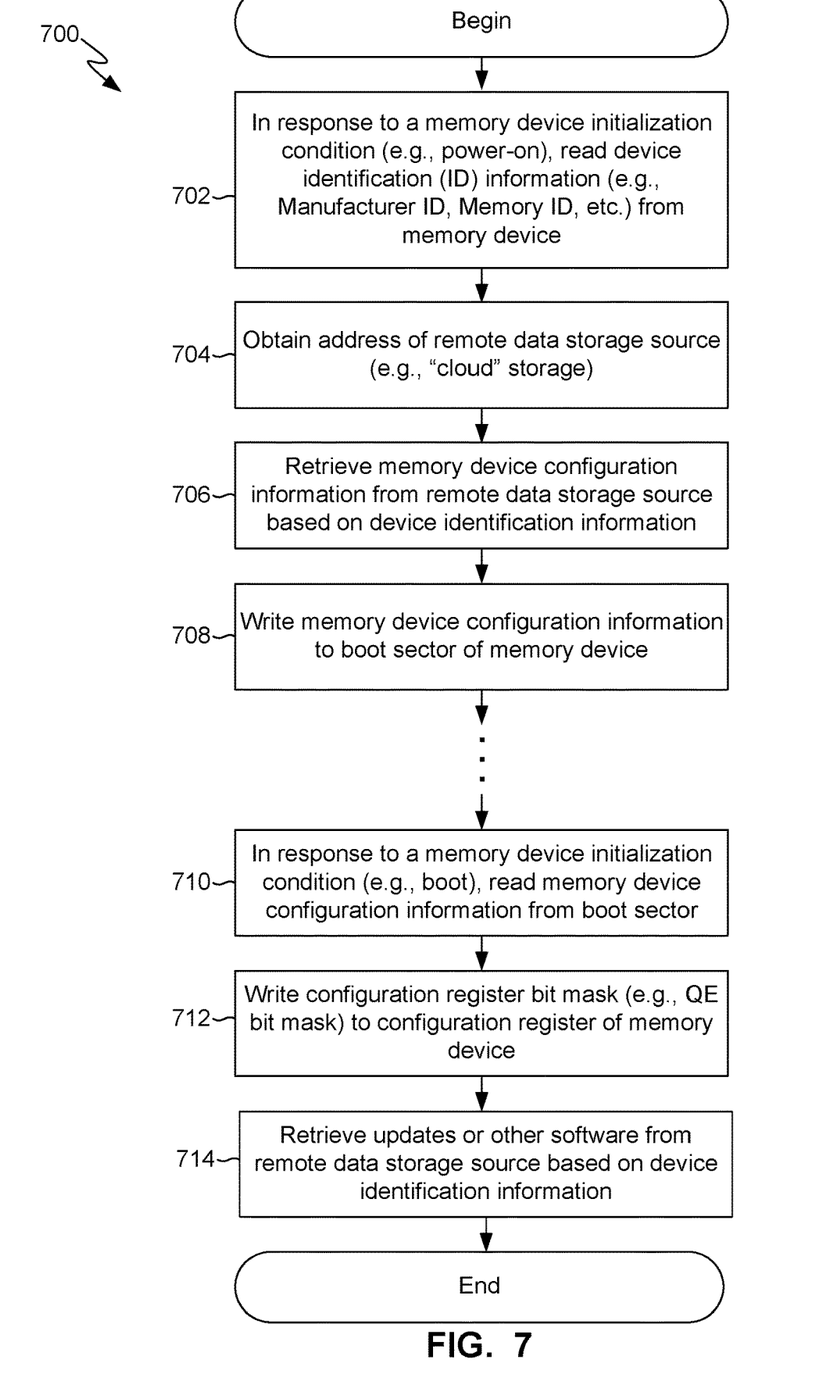
FIG. 7 is a flow diagram illustrating yet another method for memory device mode selection, in accordance with certain aspects of the disclosure.

FIG. 7 illustrates a method 700 for selecting a memory I/O mode. The method 700 may be an example of the above-described method 500 (FIG. 5). The operations described below with regard to the method 700 may be implemented by or under the control of, for example, the processor 110, which is shown not only in FIG. 1 but also in FIG. 8 in a system 800 that further includes (in addition to the elements shown in FIG. 1, such as the above-described host 102 and memory 104) a remote, network-accessible data storage source or "cloud" 802. As understood by one of ordinary skill in the art, the cloud 802 may comprise, for example, one or more server computer systems with associated data storage devices, as are commonly employed to store and retrieve data in response to queries from remote clients via a network. In this exemplary method 700, the above-described memory device configuration information 400 (FIG. 4) may be pre-stored in the cloud 802. The processor 110 may perform the method 700 under the control of the loader 116.

As indicated by block 702, the method 700 may include reading device ID information 122 (FIG. 1) from the memory 104 in response to the memory 104 powering up or otherwise being initialized. The device ID information 122 may be read under the control of the processor 110 in the manner described above with regard to the method 600 (FIG. 6).

As indicated by block 704, the method 700 may also include obtaining a network data storage address, such as an address that enables the host 102 to access the cloud 802 (FIG. 8) via a data network. The network data storage address may be stored, for example, in a one-time programmable (OTP) memory (not shown) in the host 102 or other memory accessible to the processor 110.

As indicated by block 706, the method 700 may include retrieving the memory device configuration information 400 (FIG. 4) from the cloud 802 (FIG. 8) based on the device ID information 122. As reading the memory device configuration information 400 may be implemented by or under the control of the processor 110, an arrow 804 (FIG. 8) conceptually indicates this retrieval of the memory device configuration information 400 from the cloud 802 by the processor 110. A table or other data structure or database (not shown) stored in the cloud 802 may contain a plurality of entries, each relating device configuration information with unique device ID information (e.g., a unique combination of Manufacturer ID and Memory ID) for a corresponding plurality of different memories. Thus, each device configuration information stored in the cloud 802 corresponds to a different memory, of which the memory 104 may be an example. Accordingly, for example, the cloud 802 may provide the exemplary memory device configuration information 400 in response to a query received from the host 102 that identifies the memory 104 by its unique device ID information 122.

As indicated by block 708, the method 700 may further include storing the memory device configuration information 400 (FIG. 4) in the boot sector 118 (FIG. 8) of the memory 104. The processor 110 may write the memory device configuration information 400 to the boot sector 118 using the single-bit I/O mode. The Write Command indicated in the retrieved memory device configuration information 400 may be used. Alternatively, a standard command may be used. As storing the memory device configuration information 400 in the boot sector 118 may be implemented by or under the control of the processor 110, an arrow 806 conceptually indicates this storage of the memory device configuration information 400 in the boot sector 118 by the processor 110. Although not shown for purposes of clarity, the foregoing operations indicated by blocks 702-708 may be conditioned upon the processor 110 determining upon a boot-up of the apparatus 100 that no memory device configuration information 400 is yet stored in the boot sector 118. Also, although not shown for purposes of clarity, the operation indicated by block 708 may be conditioned upon an error check similar to that described above with regard to blocks 604-606 (FIG. 6).

As indicated by block 710, the method 600 may include reading the memory device configuration information 400 from the boot sector 118 in response to a subsequent boot-up of the apparatus 100. The subsequent boot-up follows or is subsequent to the initial boot-up in response to which the memory device configuration information 400 was retrieved from the cloud 802 and stored in the boot sector 118 as described above with regard to blocks 702-708. Other operations may occur, and any amount of time may elapse, between the initial boot-up and a subsequent boot-up. Such possible other operations, elapse of time, etc., are indicated by the ellipsis symbol (" . . . ") between blocks 708 and 710. Thus, if the processor 110 determines upon a boot-up of the apparatus 100 that memory device configuration information 400 is already stored in the boot sector 118, the method continues with block 710.

As indicated by block 712, the method 600 may proceed with writing the configuration register bit mask portion of the memory device configuration information 400 to the configuration register 108 of the memory 104. The processor 110 may write to the configuration register 108 using the single-bit I/O mode. The Write Command indicated in the retrieved memory device configuration information 400 may be used. This write operation may include writing a value to the QE bit of the configuration register 108 that indicates enabling operation in the quad-bit I/O mode. In accordance with the example described above with regard to FIG. 3, a "1" may be written to the S9 bit, i.e., the QE bit, of the configuration register 108 to enable operation in the quad-bit I/O mode. An arrow 808 (FIG. 8) conceptually indicates writing the configuration register bit mask, including the QE bit, to the memory 104 by the processor 110. In response to writing a value to the QE bit indicating operation in the quad-bit I/O mode, the memory 104 may configure itself to operate in the quad-bit I/O mode instead of the single-bit I/O mode.

Following enabling or selecting the quad-bit I/O mode as described above, further memory access operations may be performed using the quad-bit I/O mode. Such further memory access operations may include reading or writing data under control of, for example, one or more applications 112. Although not shown for purposes of clarity, further read and write operations using the quad-bit I/O mode may be conditioned upon an error check similar to that described above with regard to blocks 612-614 (FIG. 6).

Figure 8:
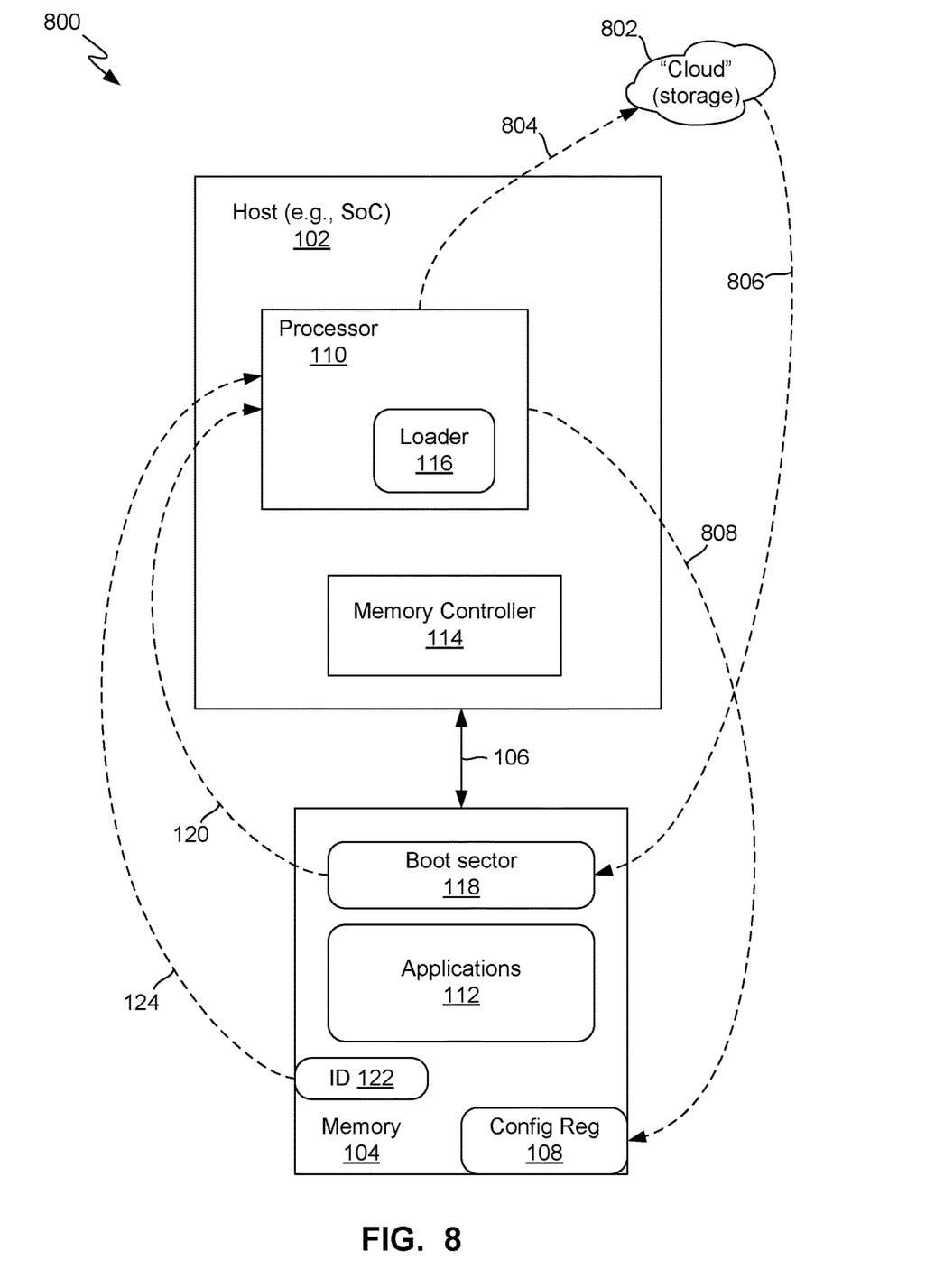
FIG. 8 illustrates a system for memory device mode selection, in accordance with certain aspects of the disclosure.

As indicated by block 714, the network data storage address also may be used to retrieve software, such as one or more applications 112 or updates to such applications 112, from the cloud 802. Although not separately shown for purposes of clarity, the applications 112 may include not only end-user applications but also lower-level configuration software that may be involved in the operation of the apparatus 100.

In a manufacturing setting in which two or more business entities are involved in the production of the apparatus 100 (FIG. 1), such as an Original Equipment Manufacturer (OEM) that builds the apparatus 100 for an Original Design Manufacturer (ODM), the ODM may employ the cloud 802 to isolate software that the ODM considers confidential from direct access by the OEM. It should be apparent that the system 800 and method 700 may enable such manufacturers to incorporate any of a number of different memories without a need for different host (e.g., SoC) firmware, such as the loader 116. Rather, a further production run incorporating a different memory can be accommodated by uploading into the cloud 802 a new entry relating new device ID information and corresponding device configuration information.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, and are to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method, comprising:
  retrieving, by a processor system, memory device configuration information in response to a memory device initialization condition, the memory device configuration information including input/output (I/O) mode information and a write command;
  writing, by the processor system, to a configuration register of a serial memory device using the write command, based on the I/O mode information, to indicate enablement of a plural-bit I/O mode, wherein the memory device configuration information further includes a wait time, and;

determining, after writing the configuration register bit mask to a configuration register and elapse of the wait time, whether an I/O mode bit of the configuration register is set to indicate enablement of the plural-bit I/O mode.

2. The method of claim 1, wherein:
the memory device initialization condition comprises a boot-up of an apparatus incorporating the memory device and the processor system; and
retrieving the memory device configuration information comprises reading the memory device configuration information from a boot sector of the memory device.

3. The method of claim 2, wherein reading the memory device configuration information from the boot sector of the memory device comprises reading using a memory single-bit I/O mode.

4. The method of claim 1, wherein retrieving the memory device configuration information comprises:
obtaining, by the processor system, the memory device configuration information from a remote data storage source via a data communication network;
storing, by the processor system, the memory device configuration information in a boot sector of the memory device; and
reading, by the processor system, the memory device configuration information from the boot sector of the memory device in response to the memory device initialization condition.

5. The method of claim 4, wherein reading the memory device configuration information from the boot sector of the memory device comprises reading using a single-bit I/O mode.

6. The method of claim 4, wherein storing the memory device configuration information in the boot sector of the memory device comprises writing using a single-bit I/O mode.

7. A method, comprising:
retrieving, by a processor system, memory device configuration information in response to a memory device initialization condition, the memory device configuration information including input/output (I/O) mode information and a write command;
writing, by the processor system, to a configuration register of a serial memory device using the write command, based on the I/O mode information, to indicate enablement of a plural-bit I/O mode;
reading device identification information from the memory device;
determining whether the device identification information matches an identification portion of the memory device configuration information; and
wherein writing the configuration register bit mask to the configuration register comprises writing the configuration register bit mask to the configuration register in response to determining the identification information matches the identification portion of the memory device configuration information.

8. An apparatus, comprising:
a host coupled to a serial memory device via a link, wherein the host comprises a processor system configured to
retrieve memory device configuration information in response to a memory device initialization condition, the memory device configuration information including input/output (I/O) mode information and a write command;
write to a configuration register of the memory device using the write command, based on the I/O mode information, to indicate enablement of a plural-bit I/O mode;
read device identification information from the memory device;
determine whether the device identification information matches an identification portion of the memory device configuration information; and
write the configuration register bit mask to the configuration register in response to determining the identification information matches the identification portion of the memory device configuration information.

9. The apparatus of claim 8, further comprising one of a computing system, a mobile computing system, an Internet of Things (IoT) device, a virtual reality system, or an augmented reality system incorporating the host, the memory, and the link, wherein the processor system is configured to perform a computing function of the one of the computing system, the mobile computing system, the Internet of Things device, the virtual reality system, or the augmented reality system.

10. The apparatus of claim 8, wherein:
the memory device initialization condition comprises a boot-up of an apparatus incorporating the memory device and the processor system; and
retrieving the memory device configuration information comprises reading the memory device configuration information from a boot sector of the memory device.

11. The apparatus of claim 10, wherein reading the memory device configuration information from the boot sector of the memory device comprises reading using a memory single-bit I/O mode.

12. The apparatus of claim 8, wherein the processor system is configured to retrieve the memory device configuration information by being configured to:
obtain the memory device configuration information from a remote data storage source via a data communication network;
store the memory device configuration information in a boot sector of the memory device; and
read the memory device configuration information from the boot sector of the memory device in response to the memory device initialization condition.

13. The apparatus of claim 12, wherein the processor system is configured to read the memory device configuration information from the boot sector of the memory device using a single-bit I/O mode.

14. The apparatus of claim 12, wherein the processor system is configured to store the memory device configuration information in the boot sector of the memory device using a single-bit I/O mode.

15. An apparatus, comprising:
a host coupled to a serial memory device via a link, wherein the host comprises a processor system configured to
retrieve memory device configuration information in response to a memory device initialization condition, the memory device configuration information including input/output (I/O) mode information and a write command;
write to a configuration register of the memory device using the write command, based on the I/O mode information, to indicate enablement of a plural-bit I/O mode, wherein the memory device configuration information further includes a wait time, and the method further includes determining, after writing the configuration register bit mask to a configuration register and elapse of the wait time, whether an I/O mode bit of the configuration register is set to indicate enablement of the plural-bit I/O mode.

16. An apparatus, comprising:
a serial memory device; and
a processor system configured to retrieve memory device configuration information in response to a memory device initialization condition, the memory device configuration information including input/output (I/O) mode information and a write command, the processor system further configured to write to a configuration register of the memory device using the write command, based on the I/O mode information, to indicate enablement of a plural-bit I/O mode;
wherein the memory device configuration information further includes a wait time, and the processor system is further configured to determine, after writing the configuration register bit mask to a configuration register and elapse of the wait time, whether an I/O mode bit of the configuration register is set to indicate enablement of the plural-bit I/O mode.

17. The apparatus of claim 16, wherein:
the memory device initialization condition comprises a boot-up of an apparatus incorporating the memory device and the processor system; and
the processor system is configured to retrieve the memory device configuration information by being configured to read the memory device configuration information from a boot sector of the memory device.

18. The apparatus of claim 17, wherein the processor system is configured to read the memory device configuration information from the boot sector of the memory device using a memory single-bit I/O mode.

19. The apparatus of claim 16, wherein the processor system is configured to retrieve the memory device configuration information by being configured to:
obtain the memory device configuration information from a remote data storage source via a data communication network;
store the memory device configuration information in a boot sector of the memory device; and
read the memory device configuration information from the boot sector of the memory device in response to the memory device initialization condition.

20. The apparatus of claim 19, wherein the processor system is configured to read the memory device configuration information from the boot sector of the memory device using a single-bit I/O mode.

21. The apparatus of claim 19, wherein the processor system is configured to store the memory device configuration information in the boot sector of the memory device using a single-bit I/O mode.

22. An apparatus, comprising:
a serial memory device; and
a processor system configured to retrieve memory device configuration information in response to a memory device initialization condition, the memory device configuration information including input/output (I/O) mode information and a write command, the processor system further configured to write to a configuration register of the memory device using the write command, based on the I/O mode information, to indicate enablement of a plural-bit I/O mode;
wherein the processor system is further configured to
read device identification information from the memory device; and
determine whether the device identification information matches an identification portion of the memory device configuration information; and
wherein the processor system is configured to write the configuration register bit mask to the configuration register in response to determining the identification information matches the identification portion of the memory device configuration information.

* * * * *